(12) United States Patent
Ajit

(10) Patent No.: US 6,720,821 B2
(45) Date of Patent: Apr. 13, 2004

(54) METHODS AND SYSTEMS FOR GENERATING INTERIM VOLTAGE SUPPLIES

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/268,781

(22) Filed: Oct. 11, 2002

(65) Prior Publication Data

US 2003/0156372 A1 Aug. 21, 2003

Related U.S. Application Data

(60) Provisional application No. 60/357,877, filed on Feb. 21, 2002.

(51) Int. Cl.$^7$ .................................................. H02J 9/00
(52) U.S. Cl. .......................... 327/530; 327/143; 307/64; 307/86
(58) Field of Search ................................ 327/198, 143, 327/530; 361/90, 91.1, 59, 86; 307/64, 81, 86, 87; 323/901

(56) References Cited

U.S. PATENT DOCUMENTS 5,742,465 A * 4/1998 Yu .............................. 361/90
6,160,430 A * 12/2000 Drapkin et al. ............. 327/143
2003/0038666 A1 * 2/2003 Wada ........................ 327/530

* cited by examiner

Primary Examiner—Timothy P. Callahan
Assistant Examiner—Terry L. Englund
(74) Attorney, Agent, or Firm—Sterne, Kessler, Goldstein & Fox PLLC

(57) ABSTRACT

Methods and systems for protecting integrated circuits ("ICs") from power-on sequencing problems provide an interim voltages during power-on sequences in order to prevent over-voltage conditions across IC terminals. Voltages at first and second terminals of a circuit are monitored and an interim voltage to the second terminal is provided when the voltage at the first terminal exceeds a first threshold and a voltage at the second terminal is below a second threshold. The interim voltage protects the circuit from excessive voltage differences across the first and second terminals during power-on sequences, and is deactivated during normal operation so as not to draw excessive current. The method/system helps to insure that multi-supply dependent logic and/or other circuitry does not receive inappropriate voltage levels, and thus helps to insure that lower voltage level based circuitry is not damaged during power-up, transients, and/or glitches.

24 Claims, 8 Drawing Sheets

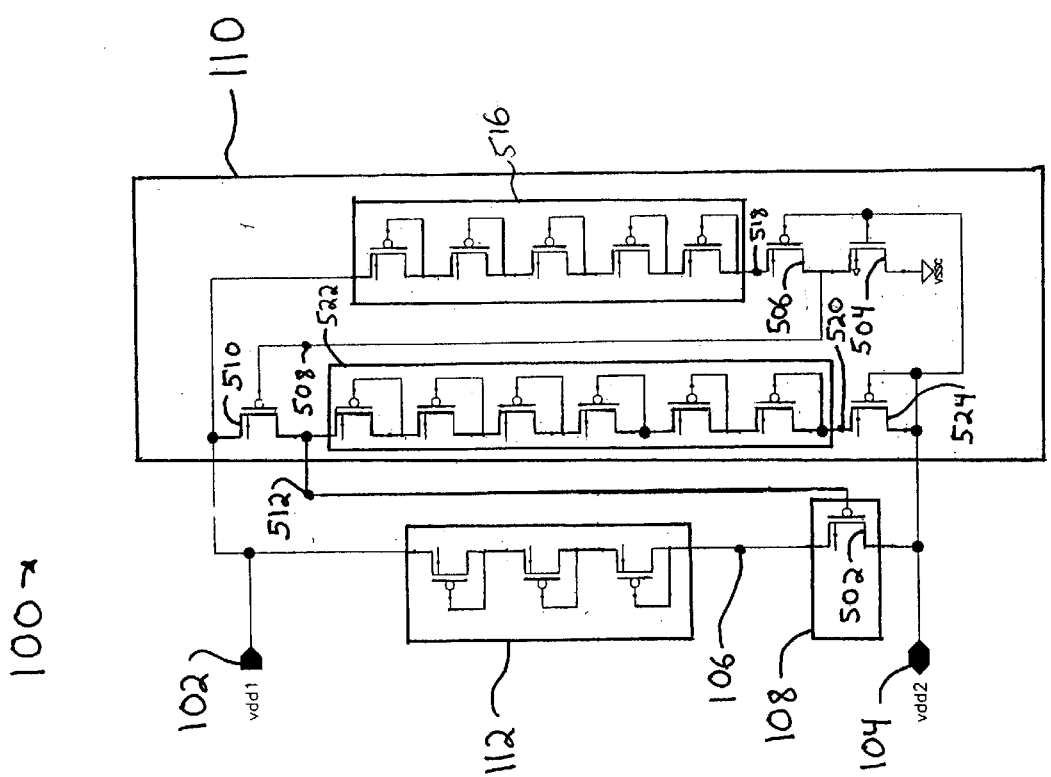

METHODS AND SYSTEMS FOR GENERATING INTERIM VOLTAGE SUPPLIES

CROSS-REFERENCE TO RELATED APPLICATIONS

This application claims priority to U.S. Provisional Application No. 60/357,877, filed Feb. 21, 2002, titled, "Methods and Systems for Generating Interim Voltage Supplies," incorporated herein by reference in its entirety.

BACKGROUND OF THE INVENTION

1. Field of the Invention

The present invention is directed to methods and systems for protecting integrated circuits ("ICs") from power-on sequence currents and, more particularly, to methods and systems for providing interim voltages during power-on sequences in order to prevent over-voltage conditions across IC terminals.

2. Background Art

Circuit boards commonly use multiple power supplies. When the power supplies are powered on at different times, undesired currents tend to flow between the power supplies. These undesired currents are referred to herein as power-on sequence currents. Power-on sequence currents can damage integrated circuits ("ICs") on the circuit boards.

For example, core logic may be designed to operate at VDDC/VDDP (1.2V/1.5V/1.8V/2.5V) while an output driver may be required to operate at VDDP/VDDO (1.5V/1.8V/2.5V/3.3V). Voltage level shifting circuits are typically used to interface core signals to the output driver control signals. Voltage level shifting circuits may be designed to operate between two or more power supplies such as VDDO and VDDC. Gate-oxide portions of transistors in these level-shifting circuits may be able to withstand maximum of VDDO-VDDC across the gate-oxide portions.

When these ICs are put into system boards, the different power-supplies may be powered-on at different times. For instance, VDDO may be powered-on before VDDC. This can cause a voltage higher than VDDO-VDDC to appear across the gate-oxide of these transistors during the power-up, potentially damaging the gate-oxide.

Another situation that can cause problems is when I/O buffers require multiple level power supplies, such as 3.3V or 2.5V for example, to interface with other circuits. A number of different I/O buffer circuits may be designed on a chip. In such a design, I/O buffers are selected according to the input signal level or I/O supply voltage level. If the I/O pad voltage is powered up before the core supply voltage is powered up, the core supply voltage may not select a proper I/O buffer circuit. As a result, a higher I/O supply voltage may be inadvertently applied to thinner gate-oxide/shorter gate length I/O circuitry.

Problems similar to those described above can also occur during transients and/or glitches on power supply lines during normal operations.

Methods and systems are needed to protect circuits from over-voltage conditions across IC terminals during power-on sequences, and/or during transients and/or glitches on power supply lines during normal operations.

BRIEF SUMMARY OF THE INVENTION

The present invention is directed to methods and systems for protecting integrated circuits ("ICs") from power-on sequence currents. More particularly, the present invention is directed to methods and systems for providing interim voltages during power-on sequences in order to prevent over-voltage conditions across IC terminals. The present invention is also directed to methods and systems providing interim voltages during transients and/or glitches on power supply lines during normal operations.

In an embodiment, a plurality of power supplies associated with a circuit are monitored. During power-up, if a first power supply is powered-up before a second power supply is powered-up, an interim voltage is provided in place of the second power supply. When the second voltage supply is powered-up, the interim voltage is deactivated.

During the monitoring process, the voltages are compared with one another and/or with one or more thresholds. For example, in an embodiment, voltages at first and second terminals of a circuit are monitored. When the voltage at the first terminal exceeds a first threshold, indicating that a first power supply is powered-on, and a voltage at the second terminal is below a second threshold, indicating that a second power supply is powered off, a voltage from an interim voltage supply is provided to the second terminal until the second power supply is powered-on.

The interim voltage protects the circuit from excessive voltage differences across the terminals during power-on sequences. In an embodiment, the interim voltage also protects the circuit during transients and/or glitches. The interim voltage is deactivated during normal operation so as not to draw excessive current. The invention helps to insure that multi-supply dependent logic and/or other circuitry does not receive inappropriate voltage levels, and thus helps to insure that lower voltage level based circuitry is not damaged during power-up, transients, and/or glitches.

The present invention is compatible with digital CMOS process technologies and typically does not require additional masking steps. In an embodiment, no additional power supplies are required for implementing the invention. Circuitry for implementing the invention uses minimal area.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein. The drawing in which an element first appears is typically indicated by the leftmost digit(s) in the corresponding reference number.

BRIEF DESCRIPTION OF THE DRAWINGS/FIGURES

The present invention will be described with reference to the accompanying drawings wherein.

DETAILED DESCRIPTION OF THE INVENTION

The present invention is directed to methods and systems for protecting integrated circuits ("ICs") from power-on sequencing problems. More particularly, the present invention is directed to methods and systems for providing interim voltages during power-on sequences in order to prevent over-voltage conditions across IC terminals. The present invention is also directed to methods and systems for providing interim voltages during transients and/or glitches on power supply lines during normal operations.

Figure 1A:
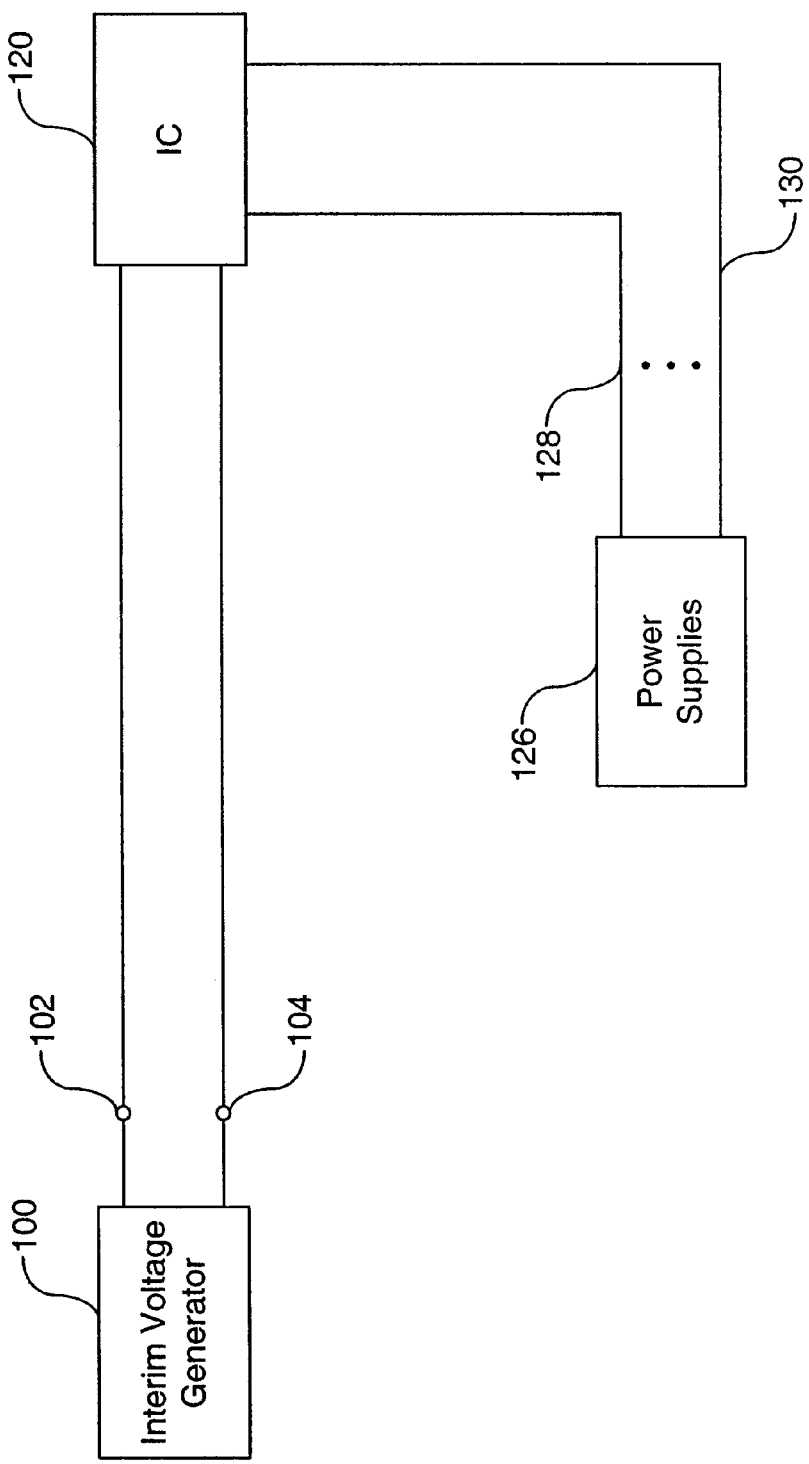
FIG. 1A is a high level block diagram of an interim voltage generator according to the present invention within an example environment.

FIG. 1A is a high level block diagram of an interim voltage generator 100 according to the present invention. The interim voltage generator 100 is implemented in an example environment to protect an IC 120 from power-on sequence currents. The IC 120 is coupled to one or more power supplies 126 that selectively provide a plurality of voltage levels on lines 128 through 130. For example, in an embodiment, the one or more power supplies 126 selectively provide a first set of one or more voltages (e.g., VDDC/VDDP (1.2V/1.5V/1.8V/2.5V)) to core logic within the IC 120, and a second set of one or more voltages (e.g., VDDP/VDDO (1.5V/1.8V/2.5V/3.3V)) to one or more output drivers within the IC 120. Alternatively, or additionally, the one or more power supplies 126 provide one or more input/output ("IO") pad voltages and one or more core supply voltages to one or more IO buffers within the IC 120.

In order to protect circuits within the IC 120, the plurality of power supplies 128–130 should be powered-on simultaneously or in a particular sequence. In practice, however, this is difficult to achieve. When the power supplies 128–130 are not powered on simultaneously or in the particular sequence, excessive voltages can be applied to the IC 120. The excessive voltages can cause undesired power-on sequence currents to flow through the IC 120. The power-on sequence currents can damage the IC 120.

In accordance with the present invention, one or more of the interim voltage generators 100 provide one or more interim voltages during power-on. The interim voltage(s) are applied to one or more terminals of the IC 120, which are coupled to one or more power supplies that are not yet powered-on. The one or more interim voltage generators 100 protect the IC 120 from over-voltage conditions.

Figure 1B:
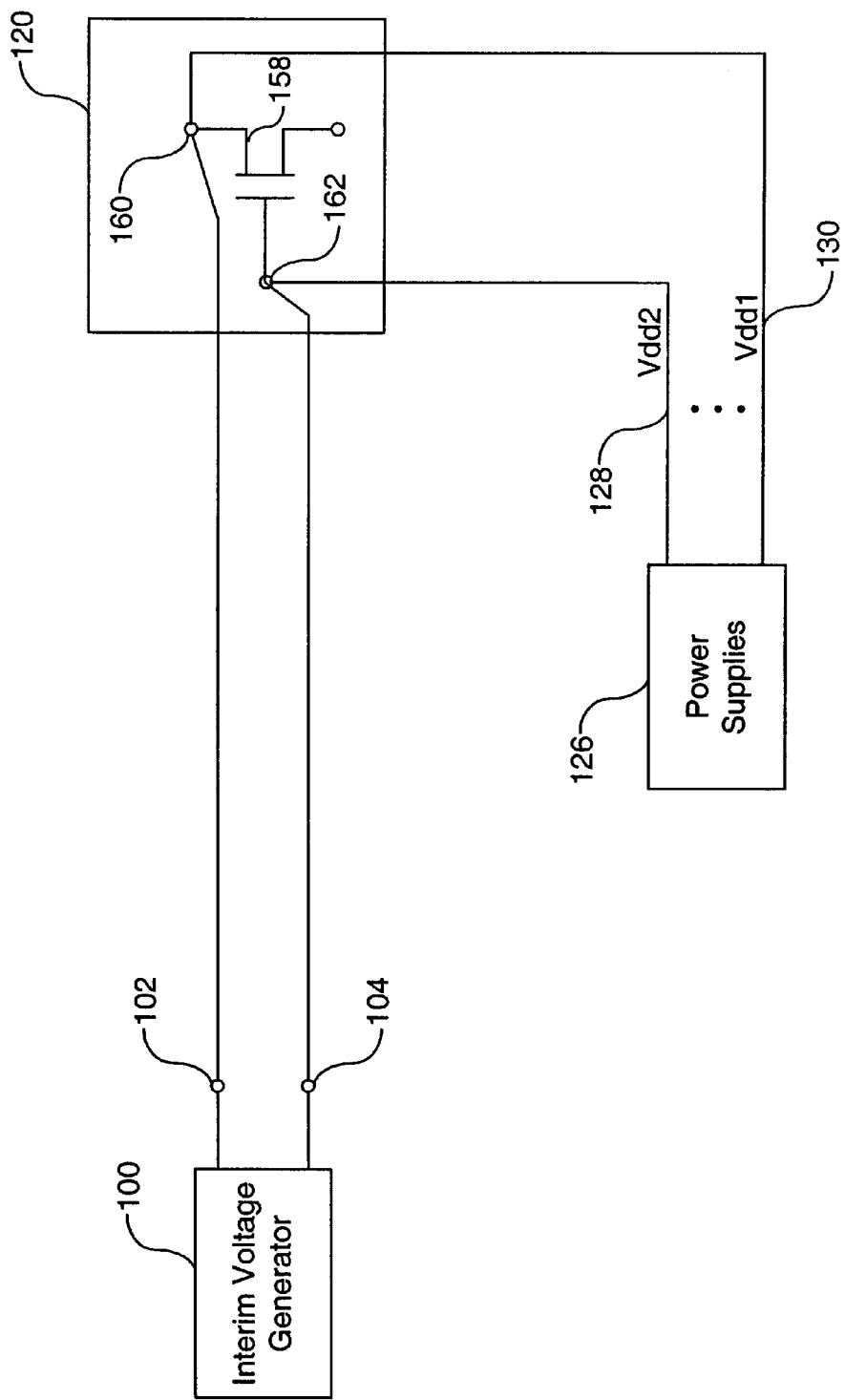
FIG. 1B is another high level block diagram of the interim voltage generator within the example environment illustrated in FIG. 1A.

The interim voltage generator 100 includes a Vdd1 terminal pad 102 and a Vdd2 terminal pad 104, which are coupled to terminals of one or more devices within the IC 120. For example, FIG. 1B illustrates an example environment where the IC 120 includes a transistor 158 having a source terminal 160 and a gate terminal 162. The Vdd1 terminal pad 102 is coupled to the source terminal 160 and the Vdd2 terminal pad 104 is coupled to the gate terminal 162. During normal operations, the source terminal 160 typically receives a Vdd1 voltage on line 130 from a Vdd1 power supply, and the gate terminal 162 receives a Vdd2 voltage on line 128 from a Vdd2 power supply. If the Vdd1 power supply is powered-on before the Vdd2 power supply is powered on, the source/gate junction of the transistor 158 can be damaged.

In accordance with the invention, the interim voltage generator 100 senses the voltage levels present at the Vdd1 terminal pad 102 and at the Vdd2 terminal pad 104. When the interim voltage generator 100 determines that the Vdd1 voltage is applied before the Vdd2 voltage is applied, the interim voltage generator 100 generates an interim Vdd2 voltage at the Vdd2 terminal pad 104. The interim Vdd2 voltage protects the IC 120 from over-voltage conditions.

For example, in FIG. 1B, when the Vdd1 voltage is applied to the source terminal 160 before the Vdd2 voltage is applied to the gate terminal 162, the interim voltage generator 100 provides the interim Vdd2 voltage to the gate terminal 162. Typically, the interim Vdd2 voltage is less than the expected Vdd2 voltage. This allows the interim voltage generator 100 to sense the expected Vdd2 voltage even when the interim Vdd2 voltage is being applied. When the interim voltage generator 100 senses that the expected Vdd2 voltage is present at the Vdd2 terminal pad 104, the interim voltage generator discontinues the interim Vdd2 voltage. In an embodiment, the interim Vdd2 voltage is generated from the Vdd1 voltage. Alternatively, the interim Vdd2 voltage is generated independent from the Vdd1 voltage.

Another example environment is where the interim voltage generator 100 protects an IO buffer within the IC 120. In this example, the Vdd1 terminal pad 102 is coupled to an output power supply terminal of the IO buffer and the Vdd2 terminal pad 104 is coupled to a core power supply terminal of the IO buffer. When the power-on sequence provides a voltage to the output power supply terminal of the IO buffer before a core voltage is applied to the core power supply terminal of the IO buffer, the interim voltage generator 100 provides the interim Vdd2 voltage to the core power supply terminal of the IO buffer until the core power supply voltage is provided by the one or more power supplies 126.

Figure 1C:
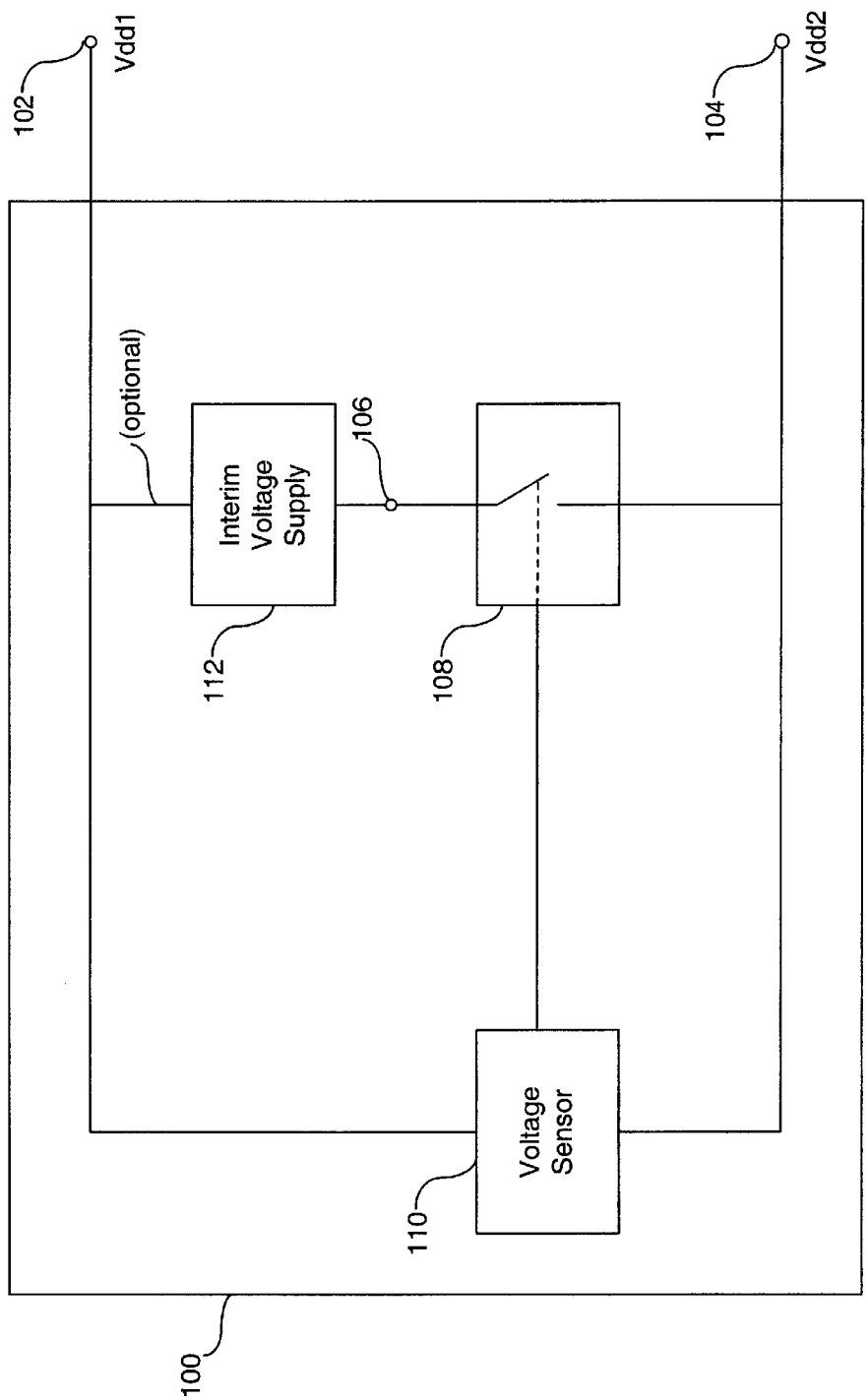
FIG. 1C is a detailed block diagram of the interim voltage generator illustrated in FIGS. 1A and 1B, in accordance with an aspect of the invention.

FIG. 1C is a high level block diagram of an example embodiment of the interim voltage generator 100, including an interim voltage supply 112 that provides the interim Vdd2 voltage at an interim Vdd2 voltage terminal 106. The interim voltage generator 100 further includes a switch 108 and a voltage sensor 110, which senses voltages at the Vdd1 terminal pad 102 and at the Vdd2 terminal pad 104. When the voltage sensor 110 determines that the Vdd1 voltage is present at the Vdd1 terminal pad 102 and that the Vdd2 voltage is not present at the Vdd2 terminal pad 104, the voltage sensor controls the switch 108 to couple the interim Vdd2 voltage terminal 106 to the Vdd2 terminal pad 104.

In an embodiment, the voltage sensor 110 compares the voltages sensed at the Vdd1 terminal pad 102 and at the Vdd2 terminal pad 104 to one or more thresholds. For example, in an embodiment, the voltage sensor 110 controls the switch 108 to couple the interim voltage terminal 106 to the Vdd2 terminal pad 104 when the voltage at the Vdd1 terminal pad 102 exceeds a first threshold and a voltage at the Vdd2 terminal pad 104 is below a second threshold. The first threshold is typically just below an expected Vdd1 voltage. The second threshold is typically just below the expected Vdd2 voltage.

When the voltage at the Vdd2 terminal pad 104 rises above the second threshold, the voltage sensor 110 controls the switch 108 to de-couple the interim Vdd2 voltage terminal 106 from the Vdd2 terminal pad 104. The second threshold is typically between the expected Vdd2 voltage and the interim Vdd2 voltage. This allows the interim voltage generator 100 to sense the Vdd2 voltage even when the interim Vdd2 voltage is being applied to the Vdd2 terminal pad 104.

When the voltage at the Vdd1 terminal pad 102 falls below the first threshold, the voltage sensor 110 controls the switch 108 to de-couple the interim Vdd2 voltage terminal 106 from the Vdd2 terminal pad 104.

In an embodiment, the interim voltage supply 112 is coupled to the Vdd1 terminal pad 102, and generates the interim voltage Vdd2 from the voltage at the Vdd1 terminal pad 102. This essentially disables the interim voltage generator 100 when the expected Vdd1 voltage is not present at the Vdd1 terminal pad 102, which helps to conserve power. In this embodiment, the switch 108 is preferably a normally-open switch so that, when the interim voltage generator 100 is disabled, the switch 108 does not couple the interim Vdd2 voltage terminal 106 to the Vdd2 terminal pad 104. Alternatively, the interim voltage supply 112 generates the interim voltage Vdd2 independent of the Vdd1 terminal pad 102.

Figure 2:
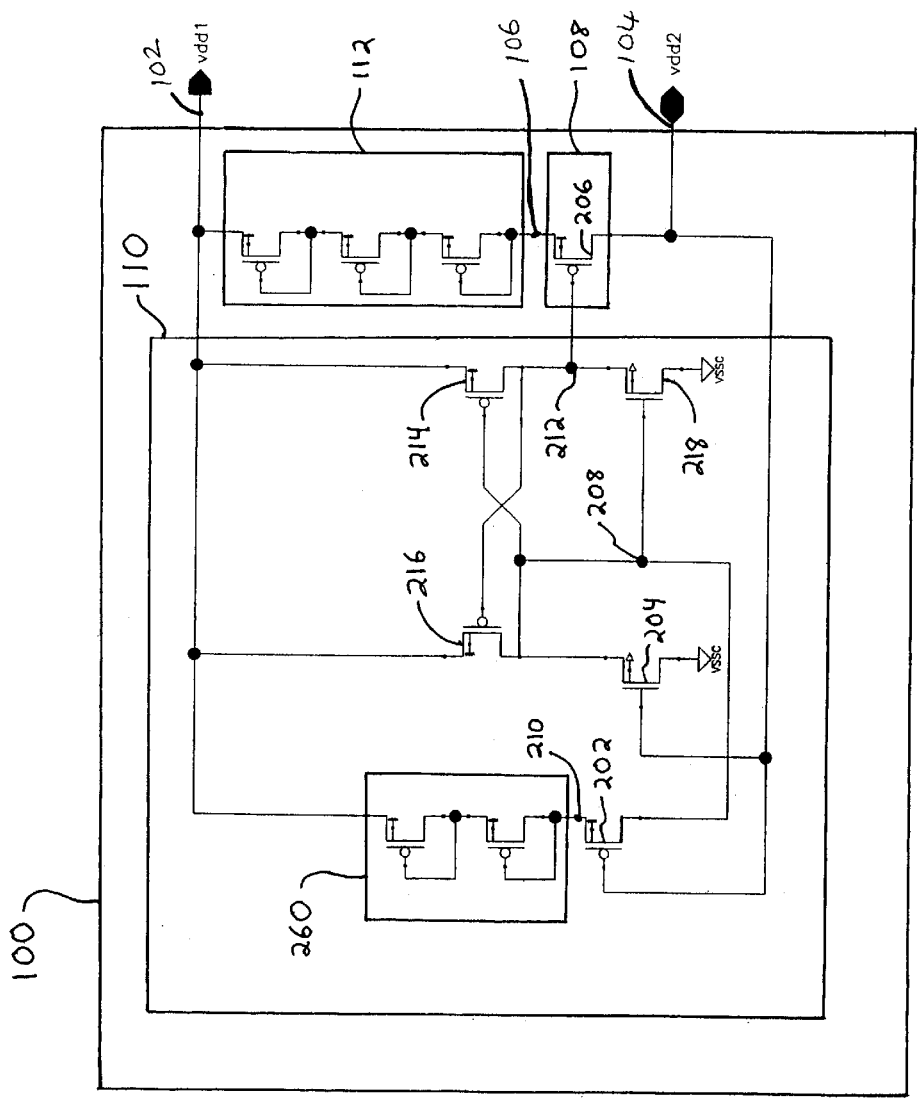
FIG. 2 is an exemplary circuit diagram of the interim voltage generator in accordance with an aspect of the present invention.

FIG. 2 illustrates an exemplary schematic diagram of the interim voltage generator 100, wherein the switch 108 is implemented with a PMOS transistor 206, and the voltage sensor 110 is implemented with a combination of PMOS transistors 202, 214, and 216, and NMOS transistors 204 and 218. The interim voltage supply 112 is implemented with a series of diode-connected PMOS transistors coupled between the Vdd1 terminal pad 102 and the interim Vdd2 voltage terminal 106. The diode-connected PMOS transistors reduce the voltage from that at the Vdd1 terminal pad 102, thereby generating the interim Vdd2 voltage at the interim Vdd2 voltage terminal 106. The interim Vdd2 voltage level is determined by the number and/or specification(s) of the diode-connected PMOS transistors in the interim voltage supply 112.

In FIG. 2, the PMOS transistor 206 is biased such that it turns on when the voltage at the Vdd1 terminal pad 102 exceeds the first threshold and the voltage at the Vdd2 terminal pad 104 is below the second threshold. When the PMOS 206 is turned on, the interim Vdd2 voltage terminal 106 is coupled to the Vdd2 terminal pad 104. The PMOS transistor 206 is further biased such that it turns off when the voltage at the Vdd1 terminal pad 102 is below the first threshold (e.g., the Vdd1 power supply is powered-off) and/or when the voltage at the Vdd2 terminal pad 104 exceeds the second threshold (e.g., the Vdd2 power supply is powered-on). When the PMOS 206 is turned off, the Vdd2 terminal pad 104 is de-coupled from the interim Vdd2 voltage terminal 106. The bias for the gate of the PMOS 206 is controlled by the voltage sensor 110, as described below.

In the example of FIG. 2, the voltage sensor 110 includes an optional voltage reducer 260, illustrated here as a second series of diode-connected transistors. The optional voltage reducer 260 protects one or more portions of the voltage sensor 110, such as the PMOS transistor 202, from excessive voltages. The optional voltage reducer 260 receives a voltage from the Vdd1 terminal pad 102 and provides a reduced voltage at a node 210. The reduced voltage at the node 210 is determined by the amplitude of the voltage at the Vdd1 terminal pad 102 and by the number and/or specification(s) of the diode-connected transistors within the voltage reducer 260. The number and/or specification(s) of the diode-connected transistors are selected so as to reduce the voltage at the node 210 to a level within specifications of, for example, the PMOS transistor 202. Alternatively, the node 210 is coupled directly to the Vdd1 terminal pad 102.

For purposes of this discussion, the Vdd1 terminal pad 102 is presumed to be coupled to a Vdd1 power supply, directly or indirectly, and the Vdd2 terminal pad 104 is presumed to be coupled to a Vdd2 power supply, directly or indirectly. The Vdd2 terminal pad 104 is also coupled to gates of the PMOS transistor 202 and the NMOS transistor 204. The PMOS transistor 202 and the NMOS transistor 204 are selected to have switching thresholds near one another.

The bias for turning on the PMOS transistor 206 is now described. When the voltage at the Vdd2 terminal pad 104 falls below the threshold of the PMOS transistor 202 and the NMOS transistor 204 (i.e., the second threshold), for example, when the Vdd2 power supply is powered-off, the PMOS transistor 202 turns on and the NMOS transistor 204 turns off. This couples the node 210 to a node 208. The node 208 is coupled to a gate of the NMOS 218. When the voltage at the node 208 rises above a threshold of the NMOS transistor 218 (i.e., when the voltage at the Vdd1 terminal pad 104 rises above the first threshold), the NMOS transistor 218 turns on. Since the voltage at the node 208 depends upon the voltage at the node 210, which depends upon the voltage at the Vdd1 terminal pad 102, the voltage at the Vdd1 terminal pad 102 essentially "enables" the voltage sensor 110 to operate. When the NMOS transistor 218 turns on, a node 212 is coupled to a relatively low potential, illustrated here as VSSC, through the NMOS transistor 218. The node 212 is coupled to a gate of the PMOS transistor 206. The relatively low voltage at the gate of the PMOS transistor 206 turns on the PMOS transistor 206, which couples the interim Vdd2 voltage terminal 106 to the Vdd2 terminal pad 104. Thus, when the Vdd2 power supply is powered-off and the Vdd1 power is powered-on, the interim voltage supply provides the interim Vdd2 voltage to the Vdd2 terminal pad 104.

In the example of FIG. 2, the interim voltage generator 100 further includes pull-up and pull-down circuitry, which is now described. The node 208 is coupled to a gate of the PMOS transistor 214. When the voltage at the node 208 rises above a threshold of the PMOS transistor 214 (i.e., when the voltage at the Vdd1 terminal pad 102 rises above the first threshold), the PMOS transistor 214 turns off. This isolates the node 212 from the Vdd1 terminal pad 102, which helps to insure the relatively low potential at the node 212. The node 212 is further coupled to a gate of the PMOS transistor 216. When the node 212 is at the relatively low potential, the PMOS 216 turns on, which couples the Vdd1 terminal pad 102 to the node 208. This brings the node 208 up to the potential of the Vdd1 terminal pad 102, which helps to insure that the NMOS transistor 218 is turned on and the PMOS transistor 214 is turned off.

The bias for turning off the PMOS 206 is now described. When the voltage level at the Vdd2 terminal pad 104 rises above the second threshold, the PMOS 202 turns off and the NMOS 204 turns on. This isolates the node 208 is from the node 210 and couples the node 208 through the NMOS 204 to the relatively low potential, illustrated here as VSSC. The relatively low potential at the node 208 turns off the NMOS 218, which isolates the node 212 from the relatively low potential. The relatively low potential at the node 208 also turns on the PMOS 214, which couples the node 212 to the Vdd1 terminal pad 102. This provides a relatively high voltage from the Vdd1 terminal pad 102 to the node 212. The relatively high voltage at the node 212 turns off the PMOS 216, which de-couples the Vdd1 terminal pad from the node 208. This insures that the node 208 is at the relatively low potential. The relatively high voltage at the node 212 also turns off the PMOS transistor 206, which de-couples the interim Vdd2 voltage terminal 106 from the Vdd2 terminal pad 104. Thus, during normal operations, when Vdd1 and Vdd2 are powered on, the interim Vdd2 voltage terminal 106 is not coupled to the Vdd2 terminal pad 104.

When the Vdd1 power supply is powered-off, the interim voltage generator 100 is effectively disabled because the node 208 will not rise above the threshold of the NMOS transistor 218. As a result, the node 212 will not be coupled to the relatively low potential necessary to control the PMOS 206 to couple the interim Vdd2 voltage terminal 106 to the Vdd2 terminal pad 104.

Figure 4:
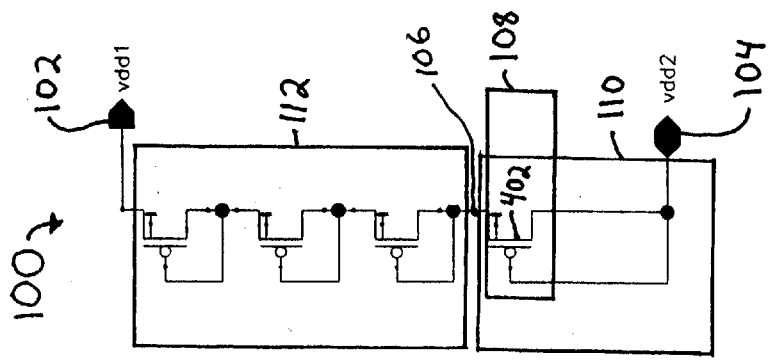
FIG. 4 is another exemplary circuit diagram of the interim voltage generator in accordance with an aspect of the present invention.

FIG. 4 illustrates another exemplary schematic diagram of the interim voltage generator 100, wherein the switch 108 and the voltage sensor 110 share a PMOS transistor 402. In operation, when a voltage at the Vdd1 terminal pad 102 is high enough to produce an interim Vdd2 voltage at the interim Vdd2 voltage terminal 106 (i.e., when the voltage at the Vdd1 terminal pad 104 rises above the first threshold), and when a voltage at the Vdd2 terminal pad 104 is below a threshold of the PMOS transistor 402 (i.e., the second threshold), the PMOS 402 turns on and couples the interim Vdd2 voltage terminal 106 with the Vdd2 terminal pad 104. The interim voltage supply 112 includes a series of diode-connected transistors, which provide an interim Vdd2 voltage that is lower than the second threshold. This insures that when the interim Vdd2 voltage is applied to the Vdd2 terminal pad 104, it does not cause the PMOS transistor 402 to turn off. When the voltage at the Vdd2 terminal pad 104 rises above the second threshold, the PMOS transistor 402 turns off, de-coupling the interim Vdd2 voltage terminal 106 from the Vdd2 terminal pad 104.

Figure 3:
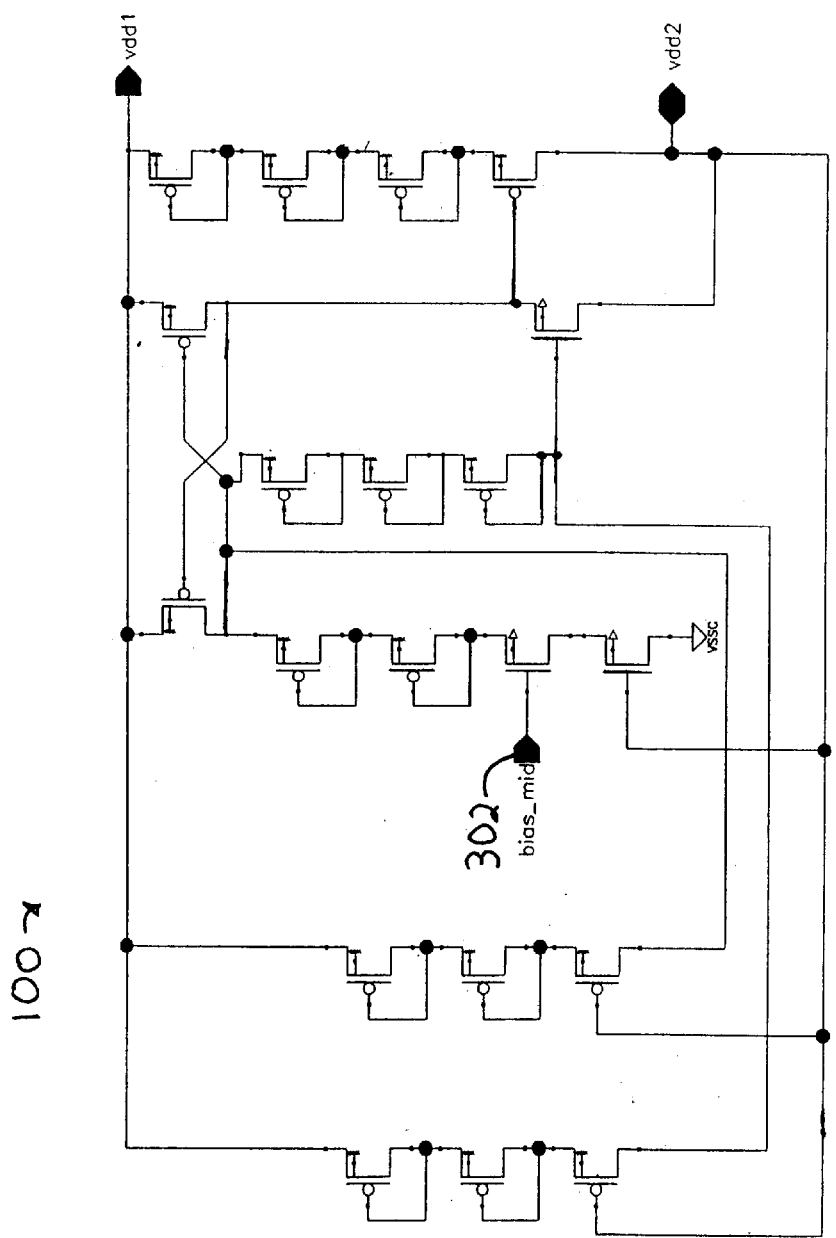
FIG. 3 is another exemplary circuit diagram of the interim voltage generator in accordance with an aspect of the present invention.

FIG. 3 illustrates another exemplary schematic diagram of the interim voltage generator 100, wherein the interim voltage generator 100 includes additional circuitry and receives a bias_mid signal 302, together which control the interim voltage generator 100 to provide an interim voltage during transients at the Vdd1 terminal pad 102. The bias_mid signal can be an internally generated voltage (e.g., 2.5 v) or an externally supplied voltage.

Figure 5:
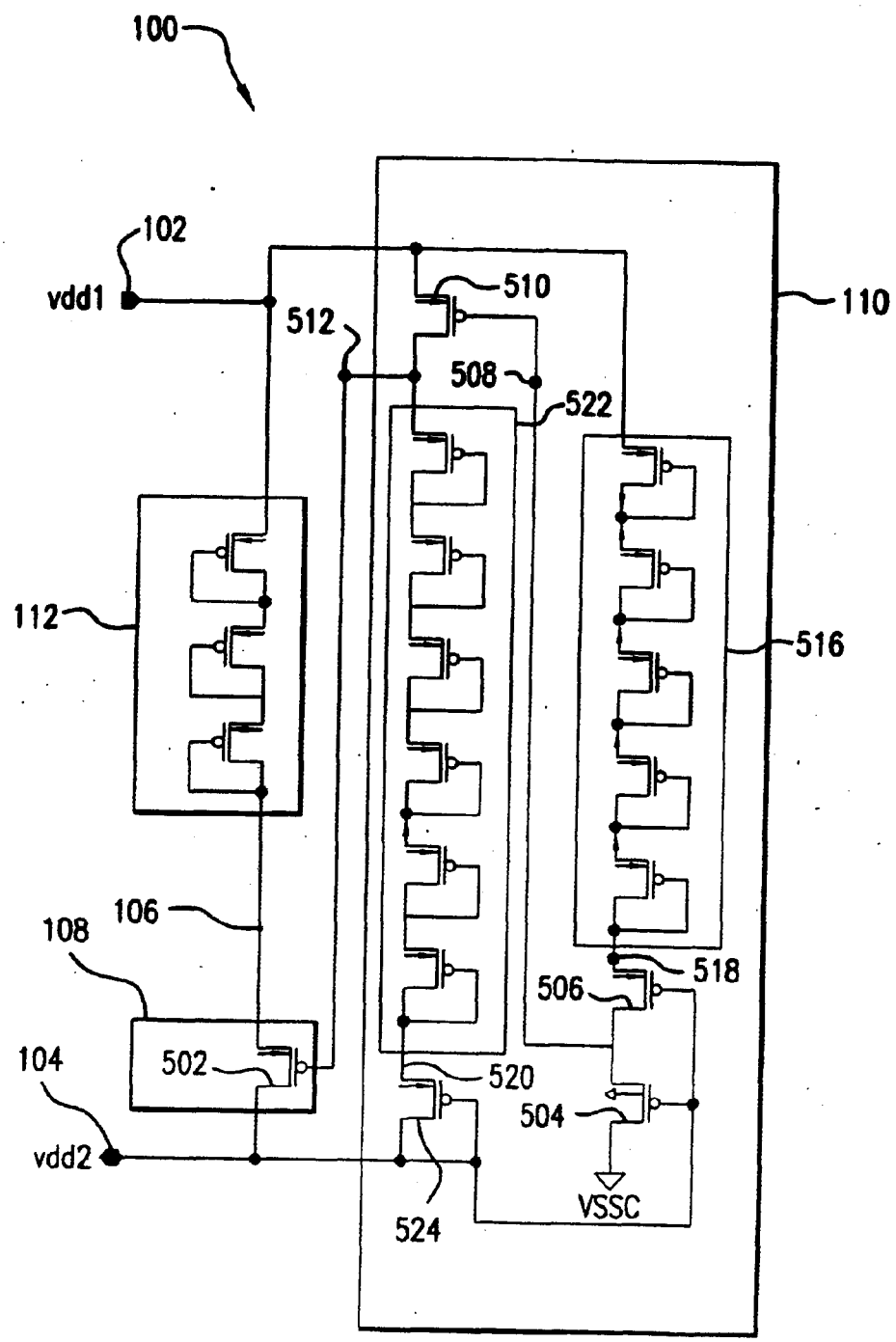
FIG. 5 is another exemplary circuit diagram of the interim voltage generator in accordance with an aspect of the present invention.
Figure 6:
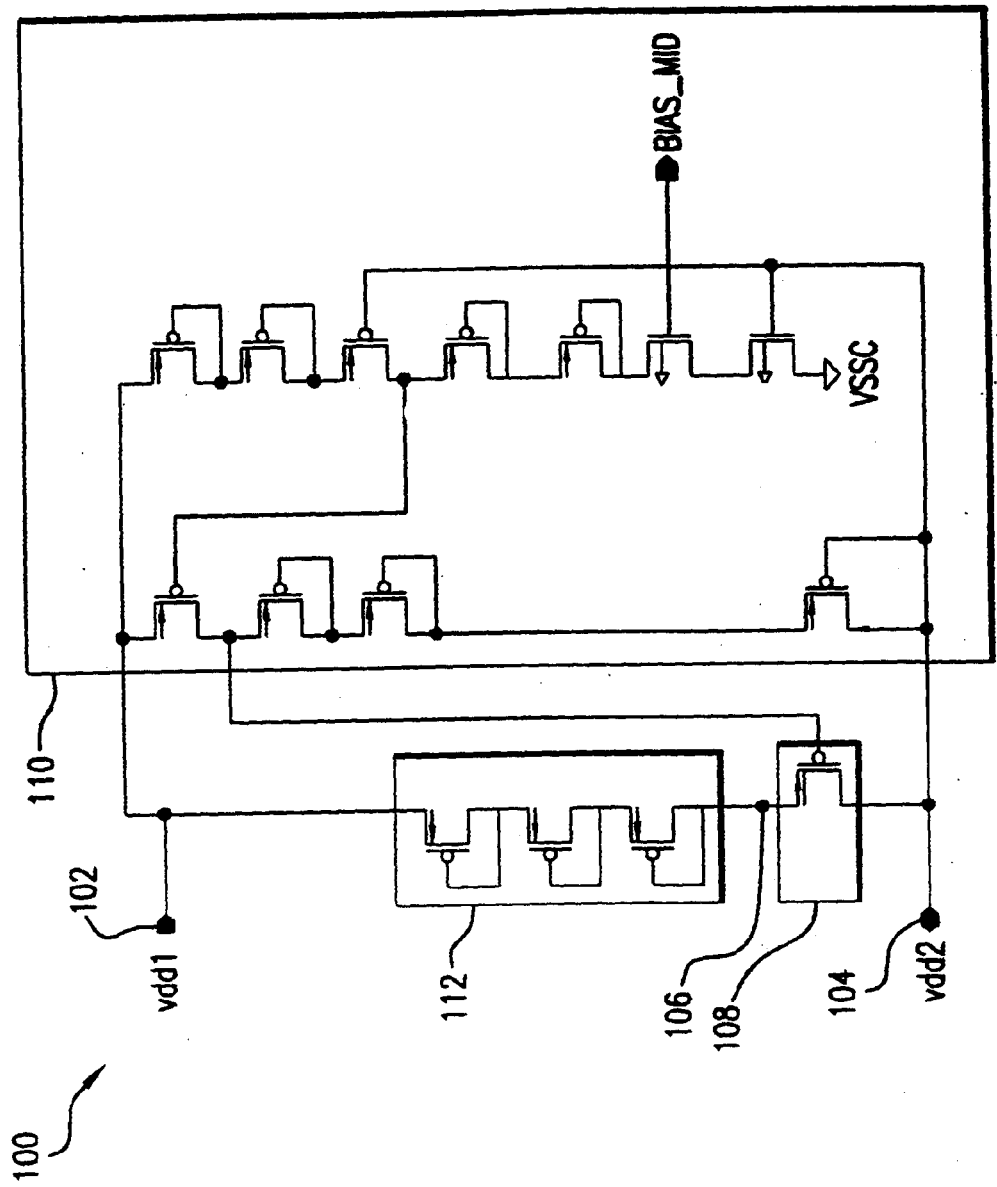
Figure 7:
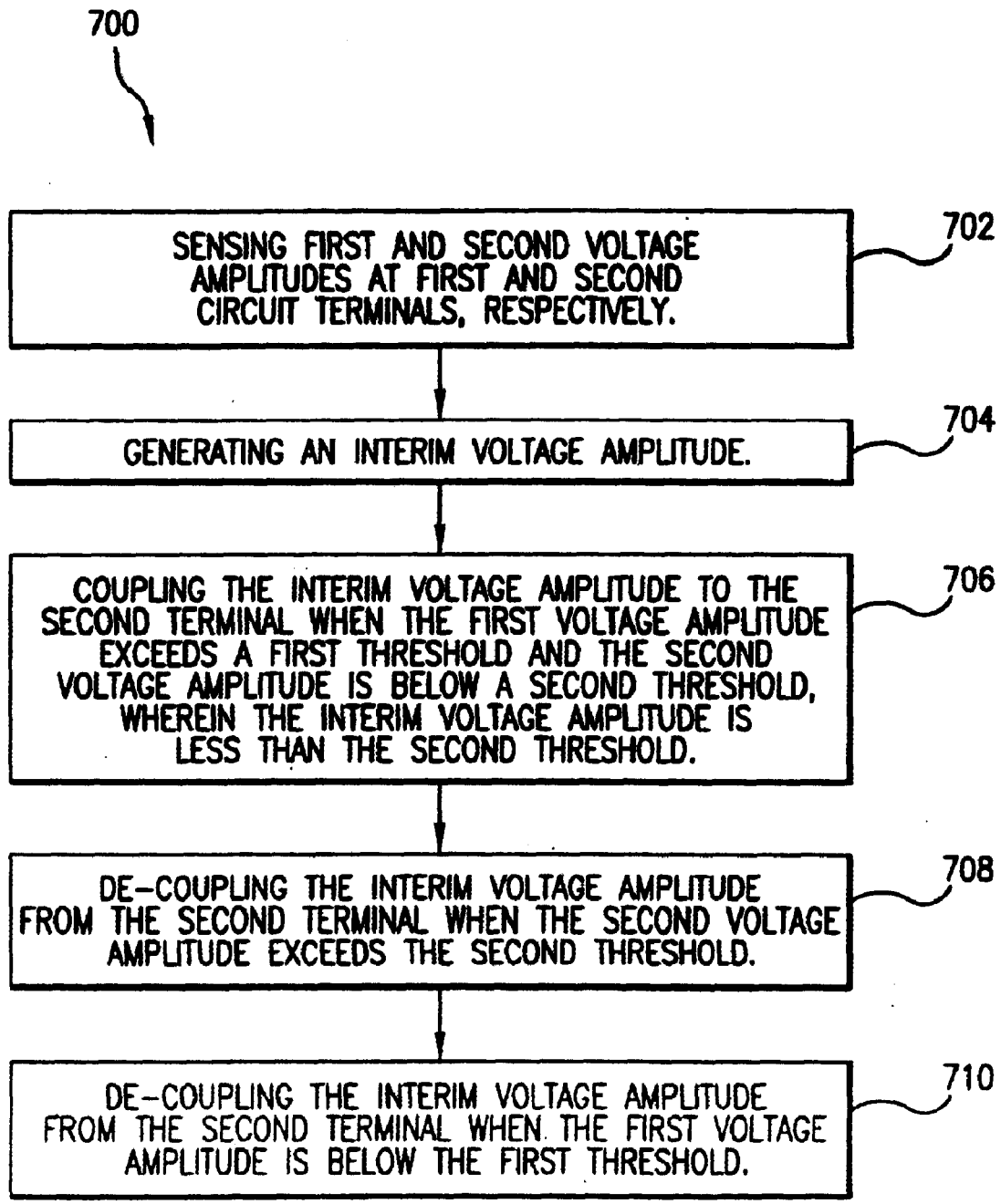

FIG. 5 illustrates another exemplary schematic diagram of the interim voltage generator 100, wherein the interim voltage generator 100 is modified to limit DC leakage current of diode-connected transistors 112 within the voltage sensor 110. The voltage sensor 110 includes a voltage reducer 516, including a series of diode-connected transistors, which provide a reduced Vdd1 voltage at a node 518. The voltage sensor 110 also includes a second series of diode-connected transistors 522. The voltage sensor 110 also includes an NMOS transistor 504, a PMOS transistor 506, and a PMOS transistor 524, which have thresholds that are similar to one another (i.e., the second threshold). Gates of these transistors are controlled by the Vdd2 terminal pad 104. The switch 108 includes a PMOS transistor 502.

The bias for turning on the PMOS transistor 502 is now described. When the Vdd2 terminal pad 104 is below the second threshold, the PMOS 524 turns on, the NMOS 504 turns-off, and the PMOS 506 turns-on. This couples the node 518 to a node 508, which provides the reduced Vdd1 voltage from the node 518 to the node 508. When the voltage at the node 508 is above a threshold of a PMOS transistor 510 (i.e., when the voltage at the Vdd1 terminal pad 102 is above the first threshold), the PMOS 510 turns off, which isolates a node 512 from the Vdd1 terminal pad 102. The node 512 is coupled to anode 520 through the second series of diode-coupled transistors 522. When the PMOS transistor 524 is turned on, the node 520 is coupled to the Vdd2 terminal pad 104 through the PMOS transistor 524. The node 512 thus has a relatively low voltage. This controls the PMOS 502 to turn-on, which couples the interim Vdd2 voltage terminal 106 to the Vdd2 terminal pad 104. The Vdd2 terminal pad 104 is then charged to the interim Vdd2 voltage, which is determined by a series of diode-connected PMOS transistors in the interim voltage supply 112.

The bias for turning off the PMOS transistor 502 is now described. When the voltage at the Vdd2 terminal pad 104 rises above the second threshold (e.g., when the Vdd2 power supply is powered on), the PMOS 524 turns off, the NMOS 504 turns on, and the PMOS 506 turns off. This isolates the node 508 from the node 518, and couples the node 508 to a relatively low potential, illustrated here as VSSC, through the NMOS transistor 504. The relatively low potential at the node 508 turns on the PMOS 510, which couples the Vdd1 terminal pad 102 to the node 512. The provides a relatively high voltage from the Vdd1 terminal pad 102 to the node 512. The relatively high voltage at the node 512 turns off the PMOS transistor 502, which de-couples the interim Vdd2 voltage terminal 106 from the Vdd2 terminal pad 104. Since the gate of PMOS 502 is tied to a relatively high voltage, the PMOS 502 is fully in the turn-off region of operation and the D.C. leakage current from node 102 (Vdd1) to node 104 (Vdd2) is reduced.

Figure 6:
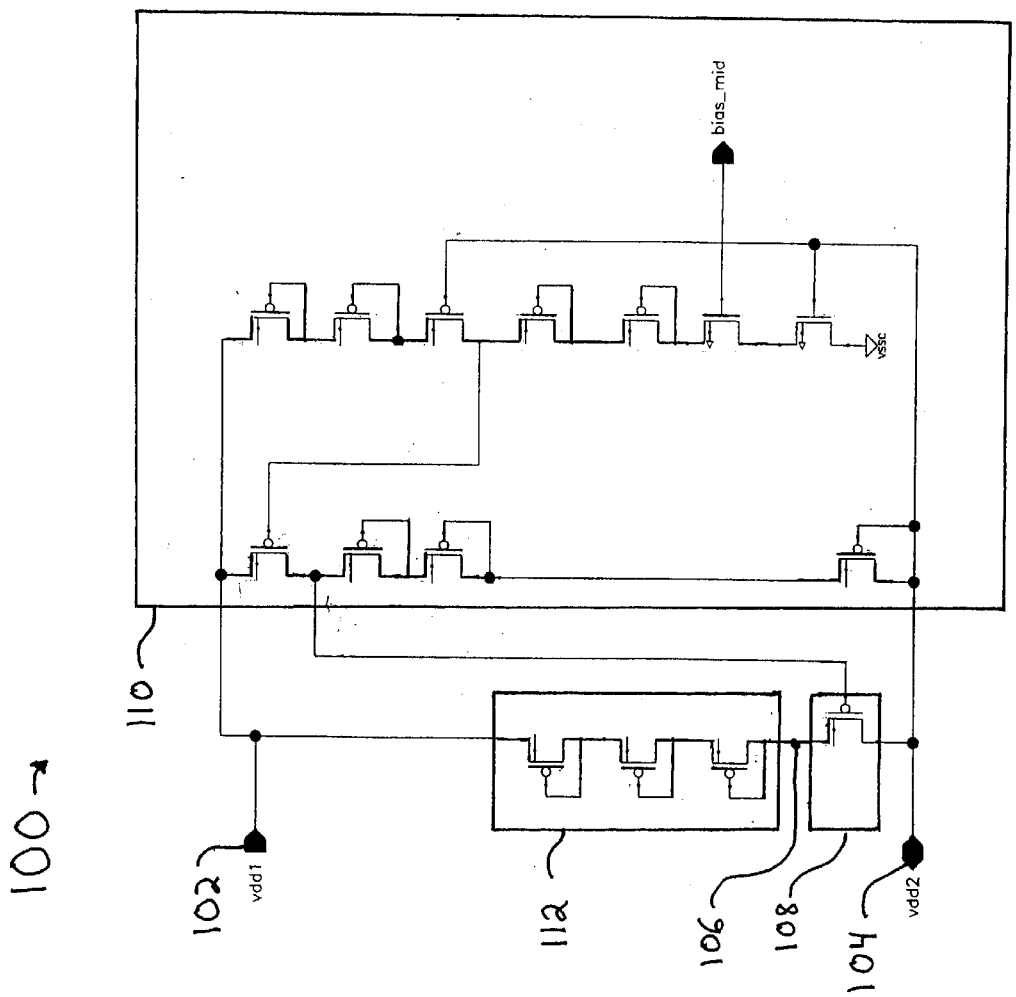
FIG. 6 is another exemplary circuit diagram of the interim voltage generator in accordance with an aspect of the present invention.

FIG. 6 illustrates another exemplary schematic diagram of the interim voltage generator 100, wherein the example of FIG. 5 has been modified to have an additional control of the interim voltage generator 100 using a bias_mid signal, which can be an internally generated voltage (e.g., 2.5 v) or an externally supplied voltage.

Referring back to FIG. 1, in an embodiment, the interim voltage generator 100 reduces effects of glitches at the Vdd2 terminal pad 102 when the Vdd1 terminal pad 102 does not have glitches at the same time.

Figure 7:
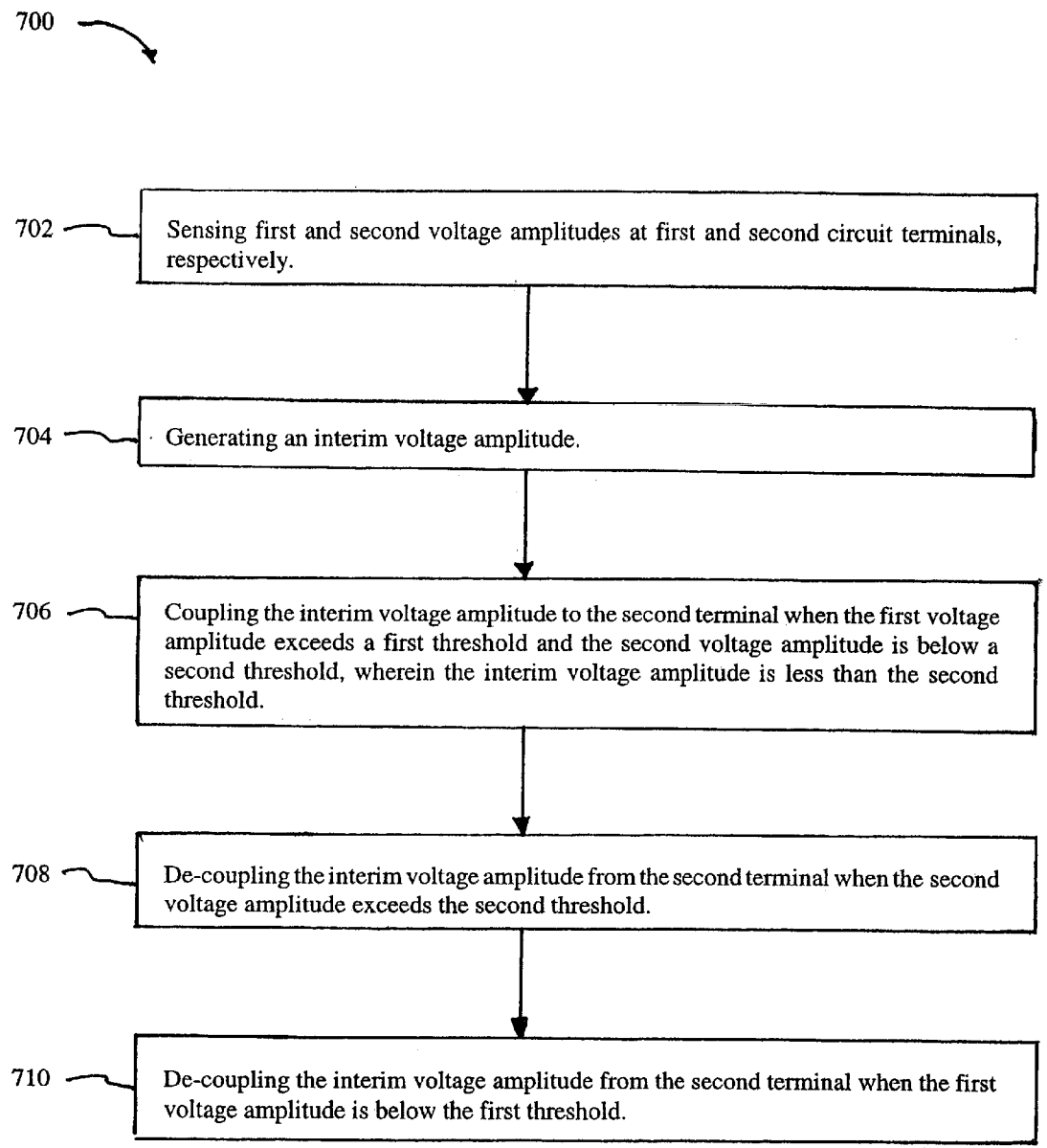
FIG. 7 is a process flowchart for implementing the present invention.
Figure 1A:
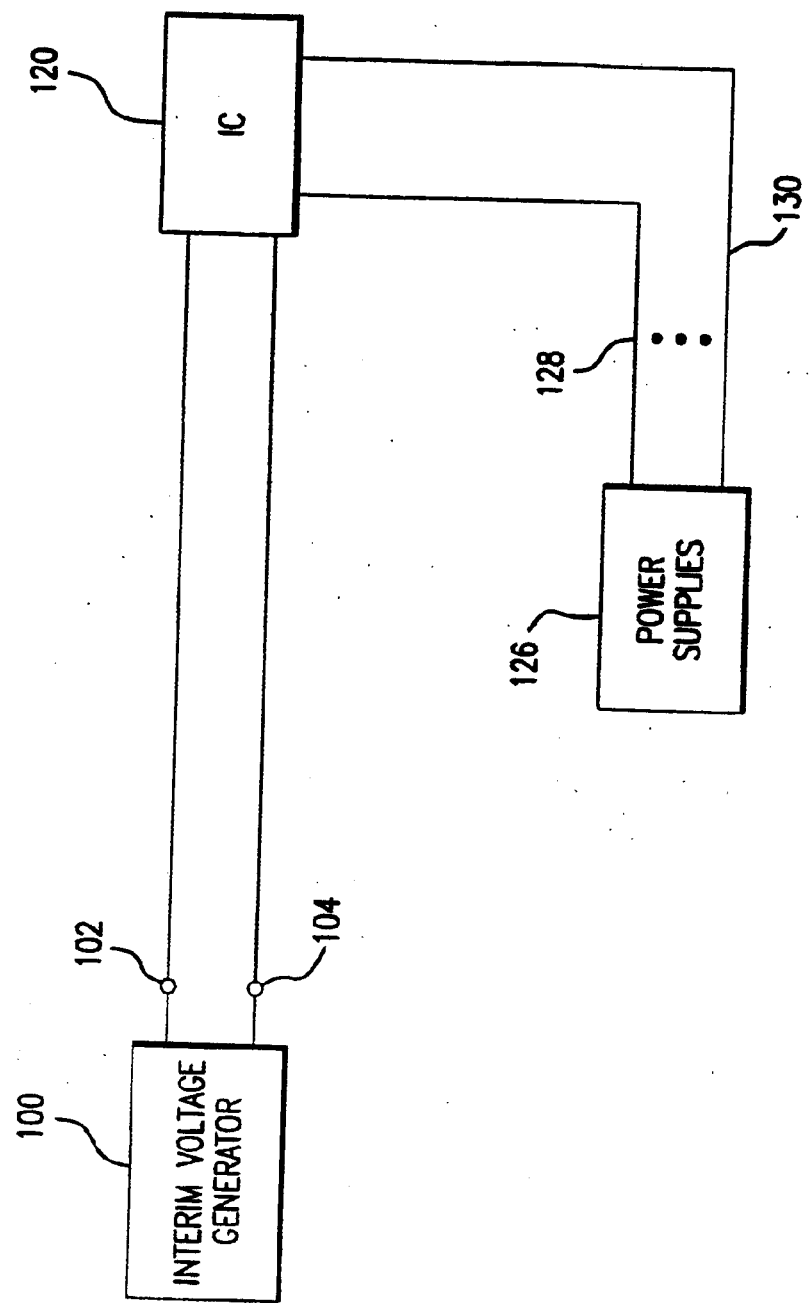
Figure 1B:
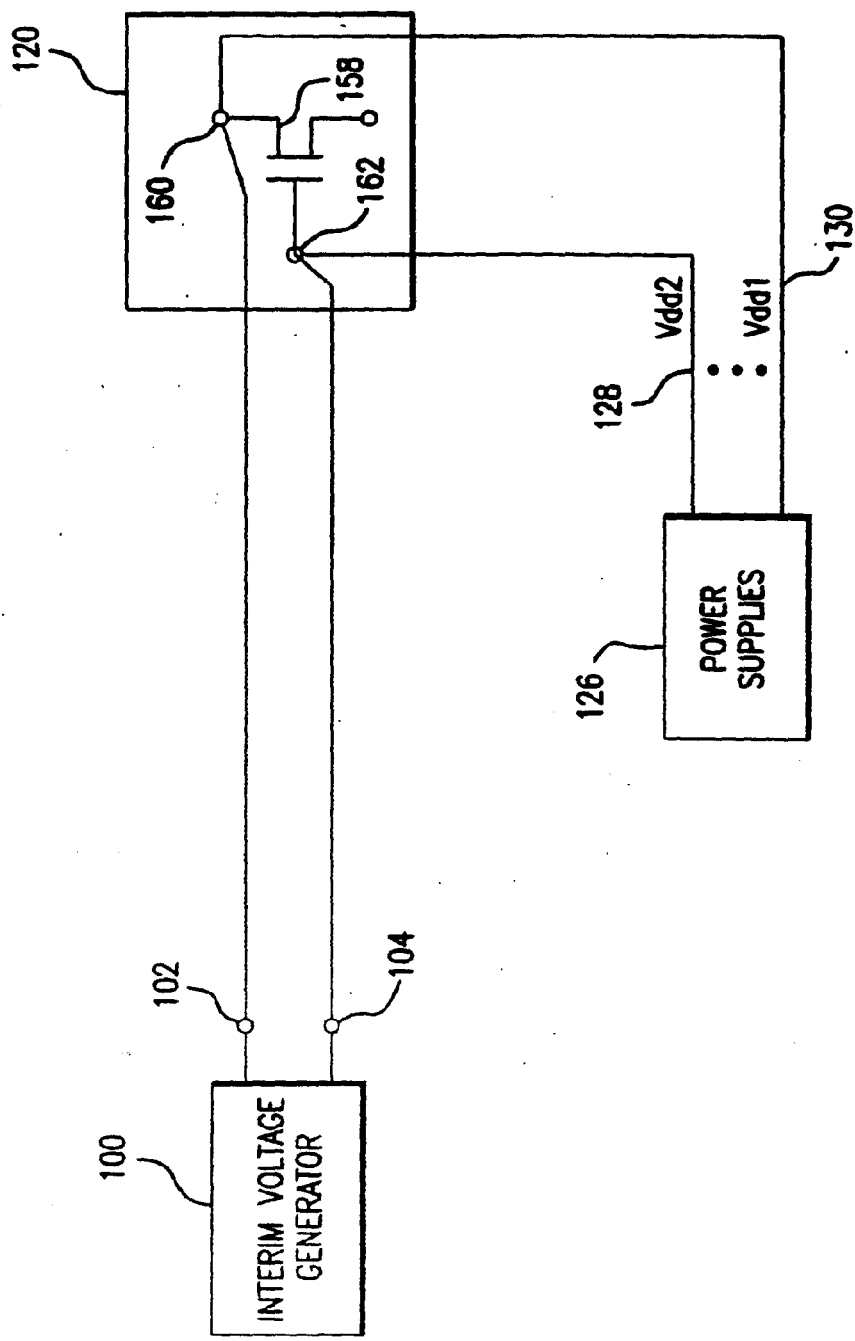
Figure 1C:
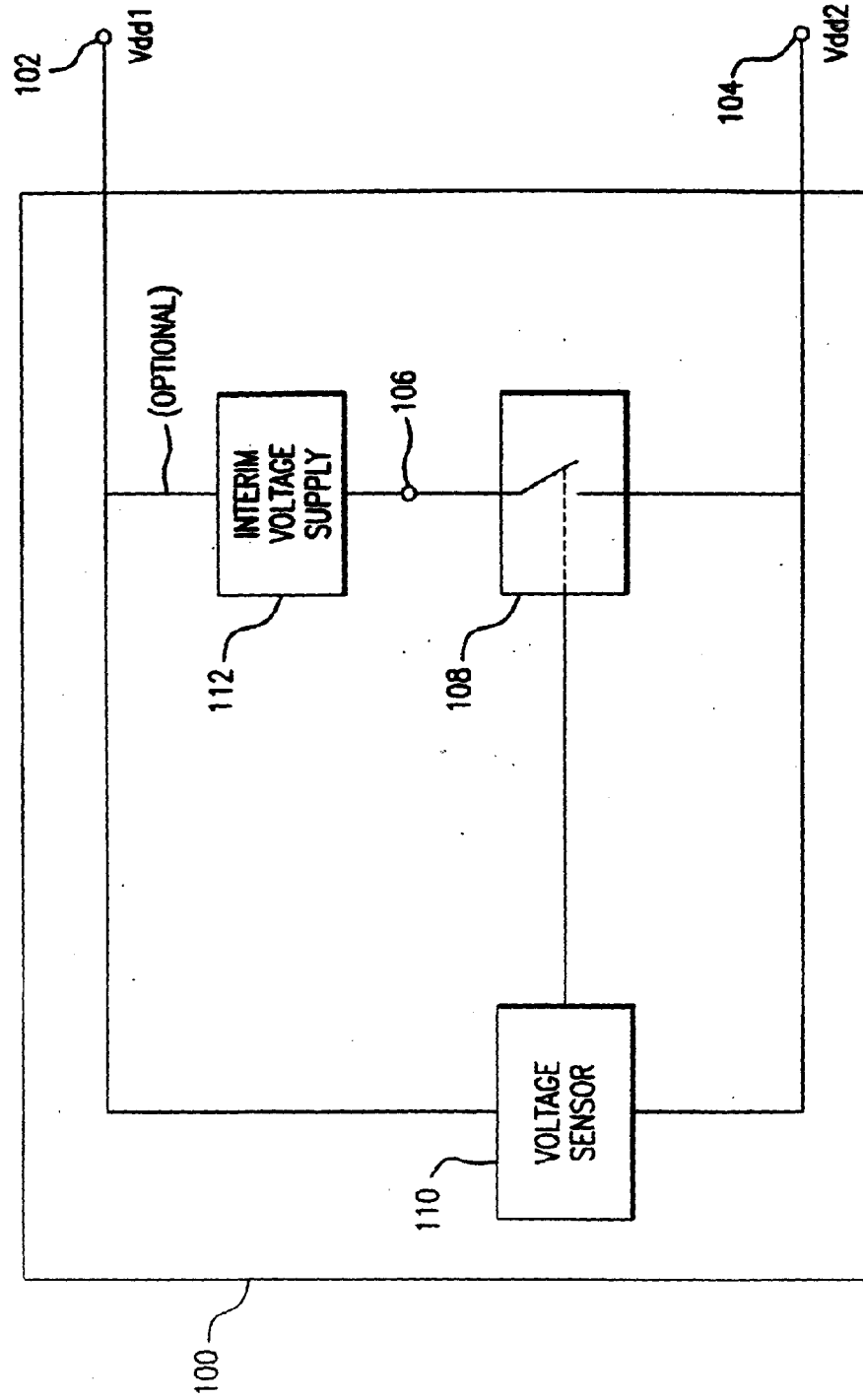
Figure 2:
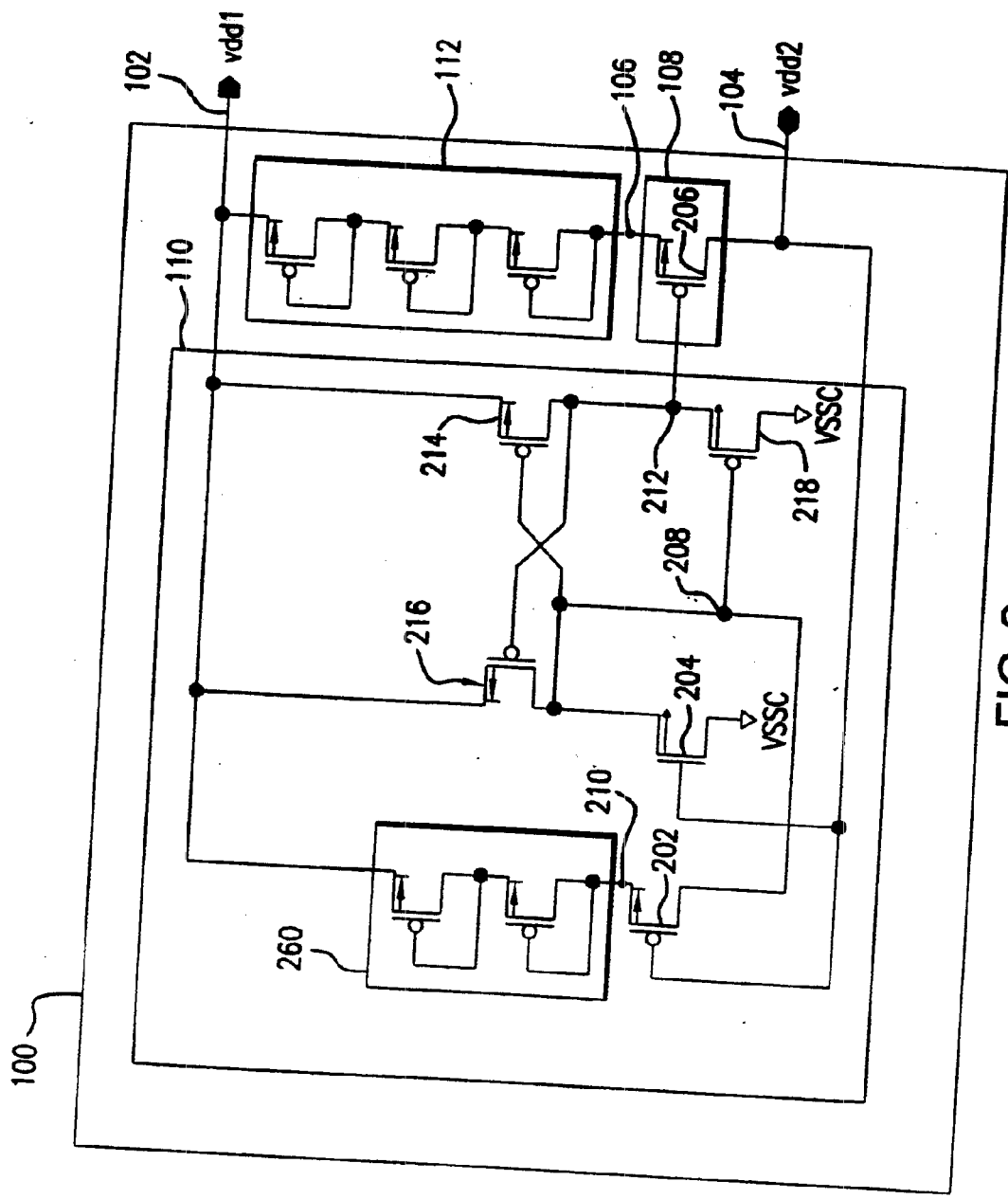
Figure 4:
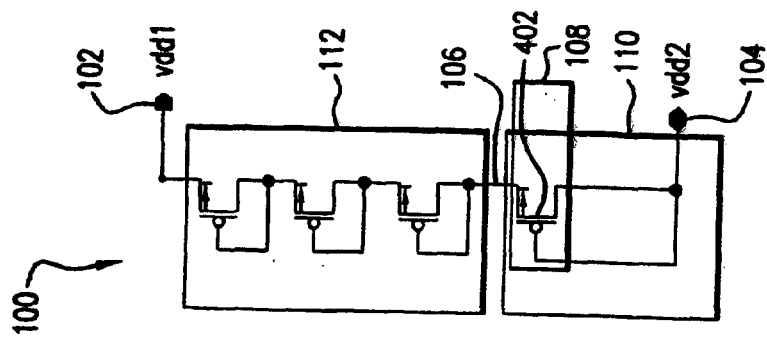
Figure 3:
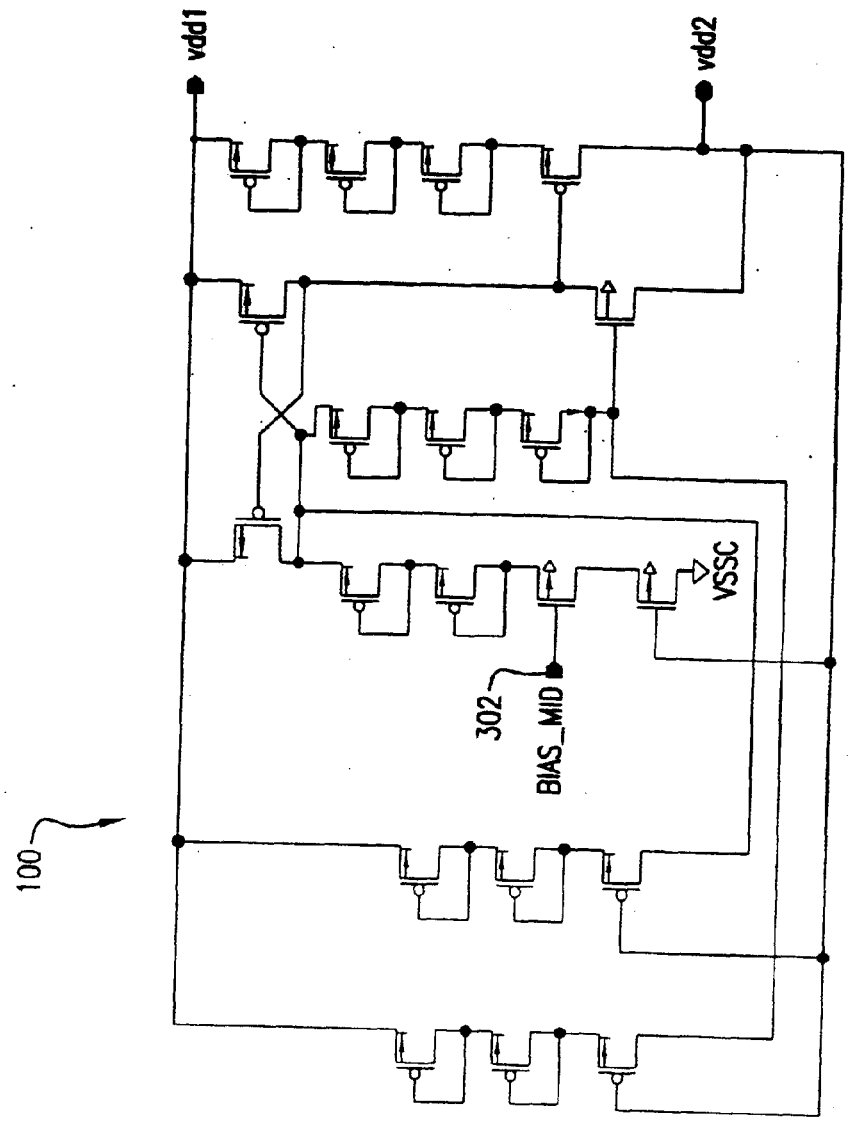

FIG. 7 is a process flowchart 700 for protecting a circuit from excessive voltage across first and second terminals of the circuit, in accordance with an aspect of the present invention. For illustrative purposes, the process flowchart 700 is described with reference to one or more of the previous drawing figures. The process flowchart 700 is not, however, limited to implementation with the previous drawing figures.

The process begins with step 702, which includes sensing first and second voltage amplitudes at the first and second terminals, respectively. In FIG. 1C, for example, the first terminal is the Vdd1 terminal pad 102, the second terminal is the Vdd2 terminal pad 104, the circuit is the transistor 158 (FIG. 1B), the first terminal is the source terminal 160, and the second terminal is the gate terminal 162.

Step 704 includes generating an interim voltage amplitude. Typically, the interim voltage amplitude is generated from the first voltage amplitude. In an alternative embodiment, the interim voltage amplitude is generated independent of the first voltage amplitude. In an embodiment, a difference between the first voltage amplitude and the interim voltage amplitude is less than a maximum allowable voltage difference across said first and second terminals of said circuit. In FIG. 1C, for example, the interim voltage is generated by the interim voltage supply 112.

Step 706 includes coupling the interim voltage amplitude to the second terminal when the first voltage amplitude exceeds a first threshold and the second voltage amplitude is below a second threshold, wherein the interim voltage amplitude is less than the second threshold. Typically, the first threshold is below an expected voltage level at the first terminal and the second threshold is below an expected voltage level at the second terminal. The first threshold is used to detect whether a first power supply is powered on, and the second threshold is used to detect whether a second power supply is powered-on. In FIG. 1C, for example, the coupling is performed by the switch 108, which is controlled by the voltage sensor 110. The first and second thresholds are set within the voltage sensor 110.

Step 708 includes de-coupling the interim voltage amplitude from the second terminal when the second voltage amplitude exceeds the second threshold. In FIG. 1C, for example, when the second power supply is powered on, as sensed at the Vdd2 terminal pad 104, the interim voltage supply is de-coupled from the Vdd2 terminal pad 104. In an embodiment, step 708 is performed even if the voltage at the first terminal does exceeds the first threshold. In other words, when the second power supply is powered on, the circuit does not need to be protected even if the first power supply is powered off.

Step 710 includes de-coupling the interim voltage amplitude from the second terminal when the first voltage amplitude is below the first threshold. In FIG. 1C, for example, when the first power supply is powered off, as sensed at the Vdd1 terminal pad 102, the interim voltage supply is de-coupled from the Vdd2 terminal pad 104. In an embodiment, step 708 is performed even if the voltage at the second terminal exceeds the second threshold. In other words, when the first power supply is powered off, the circuit does not need to be protected even if the second power supply is powered on.

In an embodiment, the circuit is a voltage level shifting circuit on a circuit board, and the circuit board further includes first circuitry that operates at a first set of voltage amplitudes, second circuitry that operates at a second set of voltage amplitudes, and a plurality of power supplies that provide the first and second sets of voltage amplitudes. In this embodiment, the voltage level shifting circuit interfaces the first circuitry with the second circuitry and selectively operates at either of the first and second sets of voltage amplitudes. In an example implementation of this embodiment, the voltage level shifting circuit includes a transistor, such as the transistor 158 in FIG. 1B, wherein the first terminal is the source terminal 160 and the second terminal is the gate terminal 162.

The example embodiments provided herein are for illustrative purposes. The invention is not, however, limited to the examples provided herein. In some of the examples provided herein, the interim voltage generator 100 is implemented for PMOS transistor circuits having positive power supplies. Based on the description herein, one skilled in the relevant art(s) will understand that the interim voltage generator 100 can also be implemented for NMOS transistor circuits having negative power supplies.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like or any combination thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for protecting a circuit from excessive voltage across first and second terminals of said circuit, comprising the steps of:
   (1) sensing first and second voltage amplitudes at said first and second terminals, respectively;
   (2) generating an interim voltage amplitude;
   (3) coupling said interim voltage amplitude to said second terminal when said first voltage amplitude exceeds a first threshold and said second voltage amplitude is below a second threshold, wherein said interim voltage amplitude is less than said second threshold;
   (4) de-coupling said interim voltage amplitude from said second terminal when said second voltage amplitude exceeds said second threshold; and
   (5) de-coupling said interim voltage amplitude from said second terminal when said first voltage amplitude is below said first threshold.

2. The method according to claim 1, wherein step (2) comprises generating said interim voltage amplitude from said first voltage amplitude.

3. The method according to claim 1, wherein step (2) comprises generating said interim voltage amplitude independent of said first voltage amplitude.

4. The method according to claim 1, wherein a difference between said first voltage amplitude and said interim voltage amplitude is less than a maximum allowable voltage difference across said first and second terminals of said circuit.

5. The method according to claim 1, wherein said circuit is a transistor, said first terminal is a source terminal of said transistor, and said second terminal is a gate terminal of said transistor.

6. The method according to claim 5, wherein said transistor is a PMOS transistor.

7. The method according to claim 5, wherein said transistor is an NMOS transistor.

8. The method according to claim 1, wherein said circuit is a voltage level shifting circuit on a circuit board, said circuit board further including first circuitry that utilizes said voltage amplitudes, second circuitry that utilizes said second voltage amplitudes, and first and second power supplies that provide said first and second voltage amplitudes to said first and second terminals, respectively, and to said first and second circuitry, respectively, wherein said voltage level shifting circuit interfaces said first circuitry with said second circuitry and utilizes said first and second voltage amplitudes, wherein said interim voltage amplitude protects said circuit board when said first power supply is powered on before said second power supply is powered on.

9. An interim voltage generator for protecting a circuit from excessive voltage differences across first and second inputs of said circuit when a first voltage amplitude is applied to said first input before a second voltage amplitude is applied to said second input, comprising:

said first and second terminals coupled to first and second power supplies, respectively;

a voltage sensor coupled between said first and second terminals, said voltage sensor including first and second thresholds;

a switch having a first contact coupled to said second terminal and a control input coupled to an output of said voltage sensor;

an interim voltage supply coupled to a second contact of said switch, said interim voltage supply providing an interim voltage amplitude that is below said second threshold;

whereby said voltage sensor senses voltage amplitudes at said first and second terminals and controls said switch to couple said interim voltage supply to said second terminal when said voltage amplitude at said first terminal exceeds said first threshold as a result of said first power supply being powered-on, and said voltage amplitude at said second terminal is below said second threshold;

whereby said voltage sensor controls said switch to de-couple said interim voltage supply from said second terminal when said voltage amplitude at said second terminal exceeds said second threshold as a result of said second power supply being powered-on.

10. The apparatus according to claim 9, wherein said interim voltage supply comprises a voltage source coupled between said first terminal and said second contact of said switch.

11. The apparatus according to claim 10, wherein said interim voltage supply comprises a series of diode-connected transistors coupled between said first terminal and said second contact of said switch.

12. The apparatus according to claim 9, wherein said interim voltage supply comprises a voltage source not coupled to said first terminal.

13. The apparatus according to claim 9, wherein said switch comprises a normally-open switch.

14. The apparatus according to claim 13, wherein said normally-open switch comprises a transistor, wherein said first contact of said switch comprises a drain terminal of said transistor, said second contact of said switch comprises a source terminal of said transistor, and said control input of said switch comprises a gate terminal of said transistor.

15. The apparatus according to claim 14, wherein said transistor comprises a PMOS transistor.

16. The apparatus according to claim 14, wherein said transistor comprises an NMOS transistor.

17. The apparatus according to claim 14, wherein said normally-open switch comprises a first PMOS transistor and said voltage sensor comprises:

a second PMOS transistor having a gate terminal coupled to said second terminal, a source terminal coupled to said first terminal, and a drain terminal coupled to a node;

a first NMOS transistor having a gate terminal coupled to said second terminal, a drain terminal coupled to a relatively low voltage potential, and a source terminal coupled to said node; and a second NMOS transistor having a gate terminal coupled to said node, a drain terminal coupled to said relatively low potential, and a source terminal coupled to said gate terminal of said first PMOS transistor, wherein said second NMOS transistor selectively couples said second NMOS transistor source terminal to one of said relatively low potential and a relatively high potential, under control of said node.

18. The apparatus according to claim 17, wherein said voltage sensor further comprises a voltage reducer coupled between said first terminal and said second PMOS transistor source terminal.

19. The apparatus according to claim 18, wherein said voltage reducer comprises a series of diode-connected transistors.

20. The apparatus according to claim 17, wherein said voltage sensor further comprises:

a third PMOS transistor having a source terminal coupled to said first terminal, a drain terminal coupled to said node, and a gate terminal coupled to said second NMOS transistor source terminal; and a fourth PMOS transistor having a source terminal coupled to said first terminal, a drain terminal coupled to said second NMOS transistor source terminal, and a gate terminal coupled to said node.

21. The apparatus according to claim 20, wherein said interim voltage supply comprises a series of diode-connected transistors coupled between said first terminal and said first PMOS transistor source terminal.

22. The apparatus according to claim 9, further comprising means for limiting DC leakage current between said first and second terminals.

23. The apparatus according to claim 9, wherein said circuit is a voltage level shifting circuit on a circuit board, said circuit board further including first circuitry that utilizes said first voltage amplitudes, second circuitry that utilizes said second voltage amplitudes, and first and second power supplies that provide said first and second voltage amplitudes to said first and second inputs, respectively, and to said first and second circuitry, respectively, wherein said voltage level shifting circuit interfaces said first circuitry with said second circuitry and utilizes said first and second voltage amplitudes, wherein said interim voltage amplitude protects said circuit board when said first power supply is powered on before said second power supply is powered on.

24. A system for protecting a circuit from excessive voltage across first and second terminals of said circuit, comprising:

means for sensing first and second voltage amplitudes at said first and second terminals, respectively;

means for generating an interim voltage amplitude;

means for coupling said interim voltage amplitude to said second terminal when said first voltage amplitude exceeds a first threshold and said second voltage amplitude is below a second threshold, wherein said interim voltage amplitude is less than said second threshold;

means for de-coupling said interim voltage amplitude from said second terminal when said second voltage amplitude exceeds said second threshold; and means for de-coupling said interim voltage amplitude from said second terminal when said first voltage amplitude is below said first threshold.

* * * * *

UNITED STATES PATENT AND TRADEMARK OFFICE
CERTIFICATE OF CORRECTION

PATENT NO. : 6,720,821 B2
DATED : April 13, 2004
INVENTOR(S) : Janardhanan S. Ajit It is certified that error appears in the above-identified patent and that said Letters Patent is hereby corrected as shown below:

Replace the drawing sheets 1-8 with formal drawing sheets 1-8 attached.

Column 10,
Line 55, please insert -- first -- before "voltage".
Lines 55 and 56, please replace "amplitudes" with -- amplitude --.

Column 11,
Line 3, please delete "said".

Column 12,
Lines 36 and 37, please replace "amplitudes" with -- amplitude --.

Signed and Sealed this

Twenty-seventh Day of September, 2005

JON W. DUDAS
*Director of the United States Patent and Trademark Office*